United States Patent
Han

(10) Patent No.: US 9,076,939 B2
(45) Date of Patent: Jul. 7, 2015

(54) REFLECTIVE POCKETS IN LED MOUNTING

(71) Applicant: COFAN USA, INC., Fremont, CA (US)

(72) Inventor: Chang Han, Pleasanton, CA (US)

(73) Assignee: COFAN USA, INC., Fremont, CA (US)

( * ) Notice: Subject to any disclaimer, the term of this patent is extended or adjusted under 35 U.S.C. 154(b) by 0 days.

(21) Appl. No.: 13/953,685

(22) Filed: Jul. 29, 2013

(65) Prior Publication Data

US 2014/0008682 A1 Jan. 9, 2014

Related U.S. Application Data

(63) Continuation of application No. 13/165,752, filed on Jun. 21, 2011, now Pat. No. 8,497,143.

(51) Int. Cl.
*H01L 33/60* (2010.01)
*H01L 25/075* (2006.01)

(52) U.S. Cl.
CPC .............. *H01L 33/60* (2013.01); *H01L 25/0753* (2013.01); *H01L 2224/48091* (2013.01); *H01L 2224/8592* (2013.01)

(58) Field of Classification Search
CPC ................ H01L 33/60; H01L 25/0753; H01L 2224/48091; H01L 2224/8592
See application file for complete search history.

(56) References Cited

U.S. PATENT DOCUMENTS

| 6,593,220 B1 * | 7/2003 | Yu et al. ........................ 438/612 |
| 7,607,800 B2 | 10/2009 | Park |
| 2004/0228113 A1 | 11/2004 | Wang |

FOREIGN PATENT DOCUMENTS

| TW | 591997 | 1/1992 |
| TW | 591980 | 5/1992 |
| TW | I33576 | 8/1994 |
| TW | P6137311 | 10/1996 |

* cited by examiner

*Primary Examiner* — Long Pham
(74) *Attorney, Agent, or Firm* — Alston & Bird LLP

(57) ABSTRACT

An LED device with improved LED efficiency is presented. An LED die is positioned within a pocket formed by a substrate and an opening in a supporting layer arranged thereon. The increase in the LED efficiency is achieved by providing a device where at least a portion of the pocket surface is reflective. This portion of the pocket surface is reflective because it is covered by either a reflective layer of foil or film, or a reflective coating, or it is polished.

14 Claims, 8 Drawing Sheets

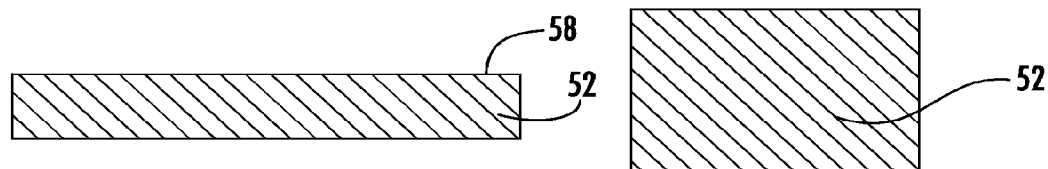
FIG. 9A
FIG. 9B
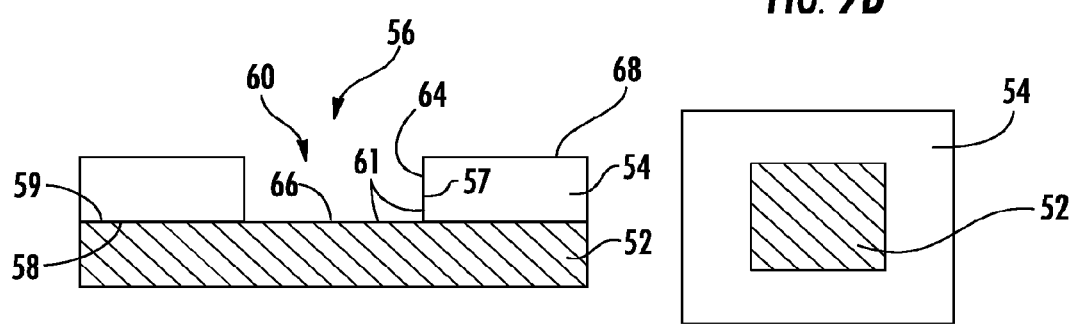
FIG. 10A
FIG. 10B
FIG. 11A
FIG. 11B
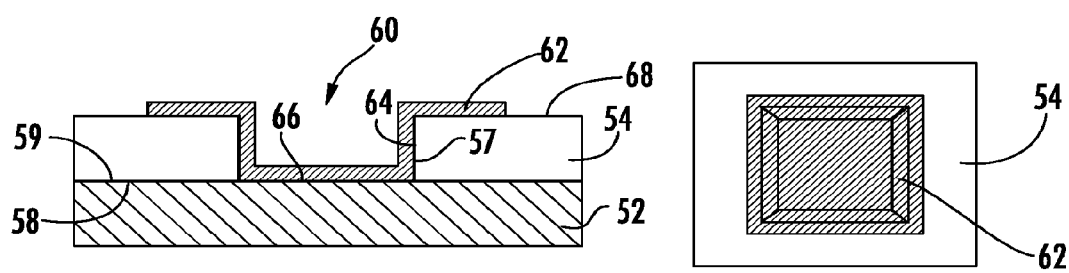
FIG. 12A
FIG. 12B

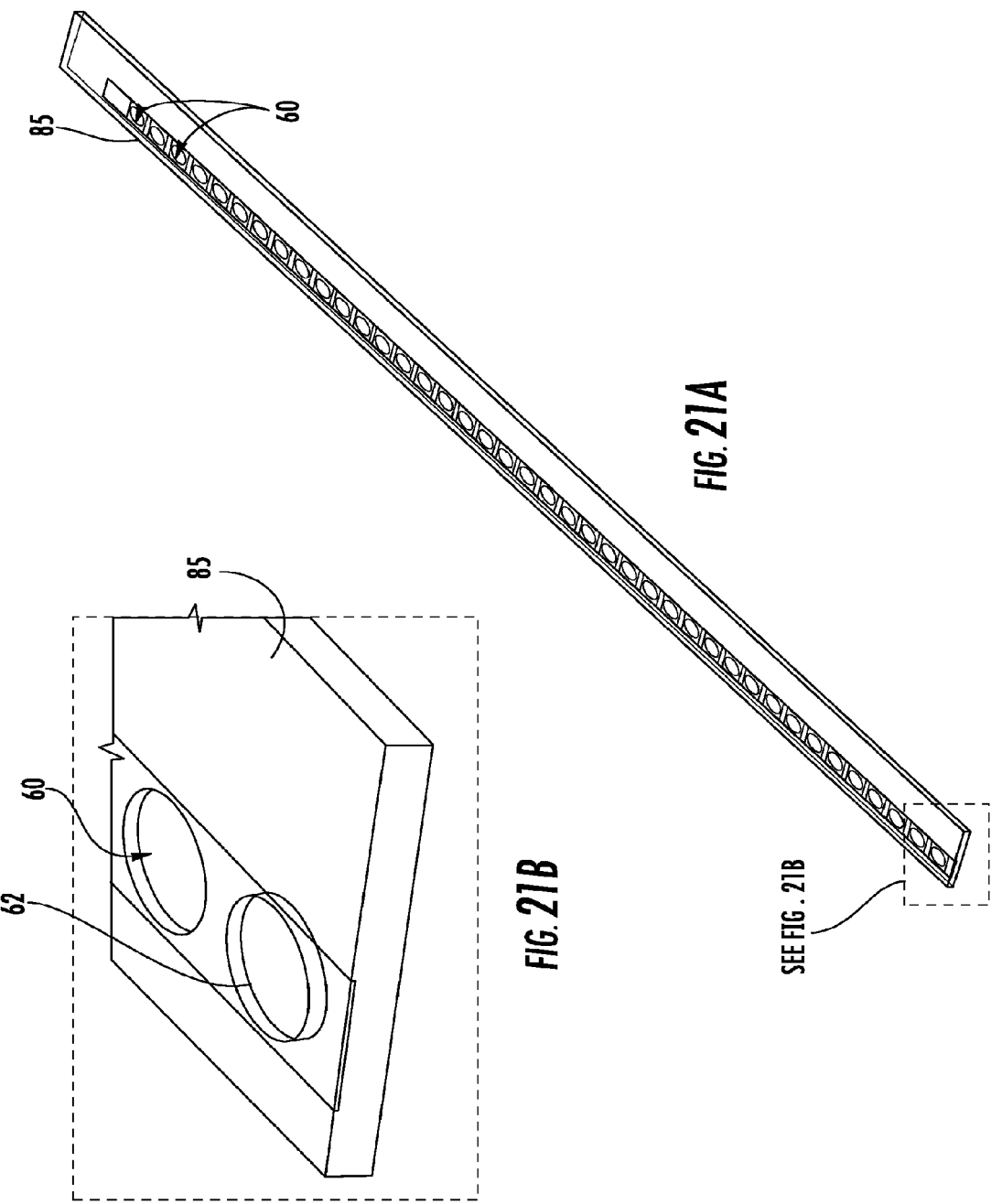

REFLECTIVE POCKETS IN LED MOUNTING

CROSS-REFERENCE TO RELATED APPLICATION

The present application is a continuation of U.S. application Ser. No. 13/165,752 filed Jun. 21, 2011. The priority information is incorporated by reference in its entirety for all purposes.

FIELD

The example embodiments of the present invention pertain generally to devices comprising light-emitting diodes (LEDs), including devices comprising surface-mounted LEDs.

BACKGROUND

Light-emitting diodes (LEDs) are widely used as a semiconductor lightning source. One of the methods of constructing an electronic circuit using an LED is surface-mount technology also known as chip-on-board (COB) technology, in which the LED is mounted directly on a printed circuit board (PCB). In COB devices, an LED die is supplied without a package and is attached directly to a circuit board. The LED die is then wire bonded and protected from mechanical damage and contamination by an epoxy "glob-top."

Performance of an LED is sensitive to the temperature of the operating environment. Operation of an LED in high ambient temperatures can cause overheating and eventually device failure. One of the advantages of the COB design for LED die attachment is the enhancement of the thermal dissipation from an LED die to a thermal conductive substrate, which improves the LED lighting efficiency because LED efficiency decreases when the temperature increases.

Presently, the most popular method for mounting LEDs on PCB is a pocket design. FIG. 1 depicts a prior-art device with typical pocket-type attachment of an LED die 1 to a thermal conductive substrate 3. A dielectric layer 5 is attached on top of the substrate 3. The dielectric layer 5 has an opening 7 to form a pocket 9 where the LED die 1 is placed. The pocket 9 is formed by the walls 11 of the opening 7 and the top surface 13 of the substrate 3.

This design suffers from the significant brightness loss due to the absorption and scattering of the LED-emitted light 15. A significant portion of the light 15 emitted by the LED die 1 goes in the direction of the walls 11. When this sideways emitted light 17 hits the walls 11, it is absorbed and/or scattered by the walls 11 because of the walls' 11 optically-absorptive qualities and because the walls 11 are not sufficiently smooth to reflect the light 17.

FIG. 2 depicts another prior art device whose design also suffers from the loss of brightness. In this instance, the LED die 1 is an ultra-violet (UV) LED die. The UV LED die 1 is positioned on the bottom of the pocket 9 formed on the top surface 13 of the substrate 3. After the die 1 is placed in the pocket 9, the pocket 9 is filled with phosphor 19. When the UV light emitted by the UV LED die 1 passes through the phosphor 19, the phosphor absorbs the UV light and emits light of the visible spectrum, white light. However, since the phosphor emits the light omnidirectionally, an even larger portion of the light is absorbed and scattered by the walls 11, compared to the device of FIG. 1.

BRIEF SUMMARY

In view of the foregoing, example embodiments of the present invention provide an LED device with improved LED efficiency and methods for making the same. The LED device solves the brightness loss problems of the devices LED die pocket design. The LED device of example embodiments of the present invention has a reflective covering over at least a portion of the pocket in which the LED die is positioned. The rays emitted by the LED and hitting the surface of the pocket are redirected outside the pocket by the reflective walls and bottom of the pocket. In some example embodiments the walls and the bottom of the pocket are covered with a reflective foil or film. In other example embodiments the walls and/or bottom of the pocket are covered with a reflective coating. In yet another example embodiment the walls and/or bottom of the pocket are polished. Also, different combinations of covering with a reflective layer, depositing a reflective coat or polishing are also described in this application. In some example embodiments of the present invention multiple LED devices are formed on the same substrate.

BRIEF DESCRIPTION OF THE SEVERAL VIEWS OF THE DRAWING(S)

Having thus described the example embodiments of the present invention in general terms, reference will now be made to the accompanying drawings, which are not necessarily drawn to scale, and wherein:

FIGS. 9A, 10A, 11A, 12A, 13A, 14A and 15A depict sectional views illustrating manufacturing steps in the assembly of the device of an example embodiment of the present invention.

FIGS. 9B, 10B, 11B, 12B, 13B, 14B and 15B are top views illustrating manufacturing steps in the assembly of the device according to an example embodiment of the present invention.

FIG. 21A depicts an exemplary embodiment of a mass production scheme for the present invention.

FIG. 21B depicts an enlarged view of an exemplary embodiment of a mass production scheme for the present invention.

DETAILED DESCRIPTION

The present disclosure now will be described more fully with reference to the accompanying drawings, in which some, but not all embodiments of the disclosure are shown. This disclosure may be embodied in many different forms and should not be construed as limited to the embodiments set forth; rather, these example embodiments are provided so that this disclosure will be thorough and complete, and will fully convey the scope of the disclosure to those skilled in the art. Like numbers refer to like elements throughout.

Figure 1:
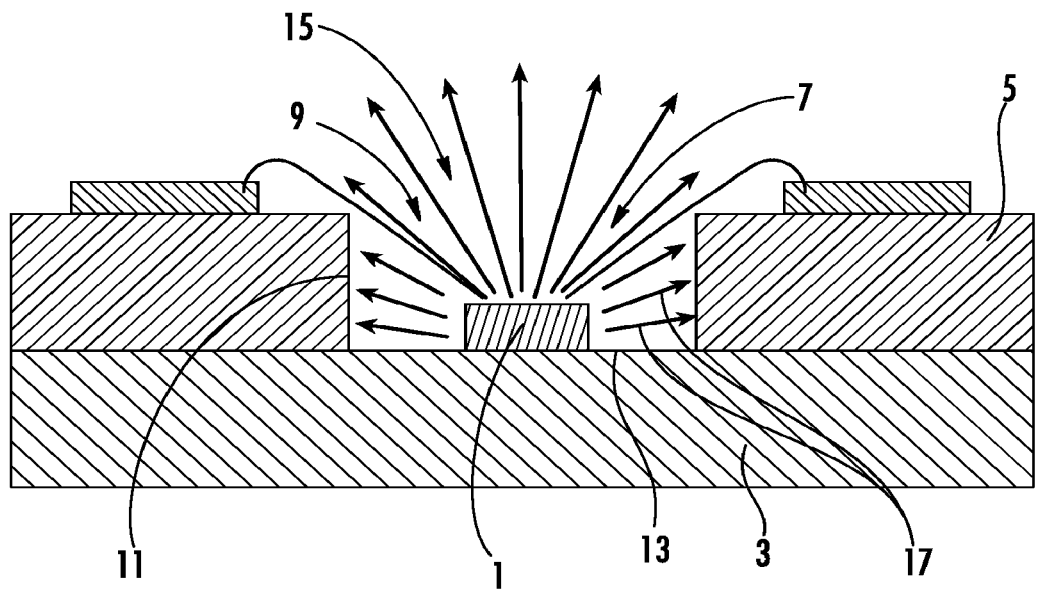
FIG. 1 depicts a cross-section diagram of a prior art device.
Figure 2:
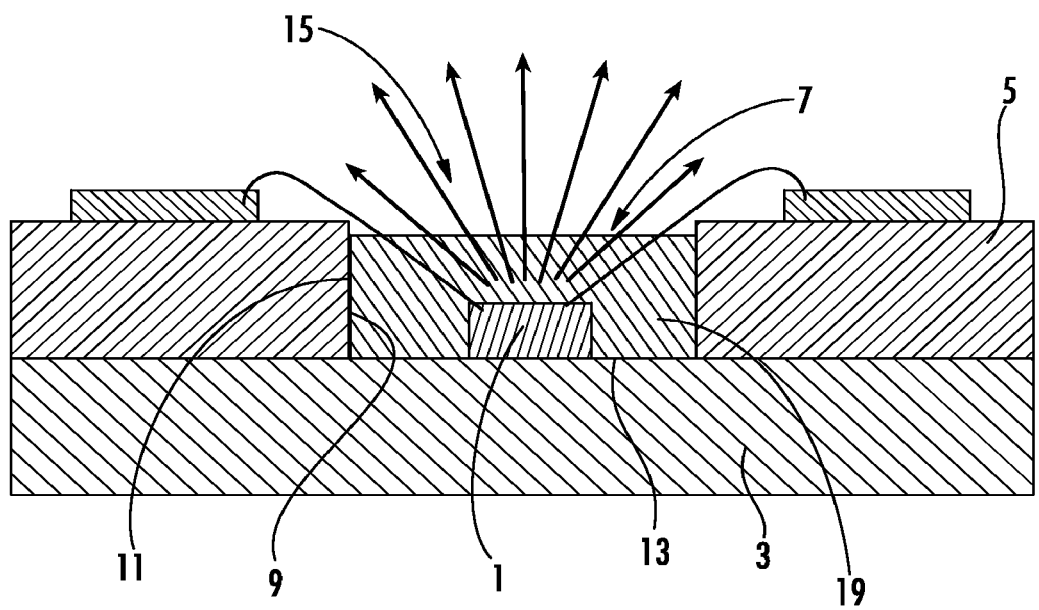
FIG. 2 depicts a cross-section diagram of another prior art device.
Figure 3:
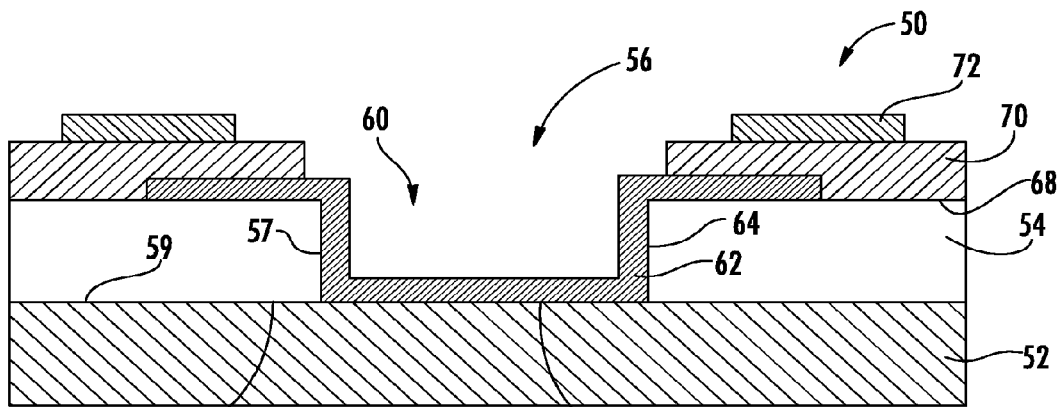
FIG. 3 depicts a cross-sectional diagram of the device of an example embodiment of the present invention.

FIG. 3 depicts a COB-mounted LED device 50 according to one example embodiment of the present invention. The device comprises a substrate 52. In some example embodiments, the substrate 52 is made of a material with high thermal conductivity. In some example embodiments, the substrate 52 is made of metal, such as aluminum, copper, gold, silver, tungsten, zirconium, and zinc, or of alloy, such as alloy, such as aluminum 2024, aluminum 5052, aluminum 6061, aluminum 7075, aluminum A356, brass yellow, brass red, and copper alloy 11000. In some example embodiments, the substrate 52 is made of ceramic, such as aluminum nitride, silicon carbide, alumina, and silicon nitride.

A supporting layer 54 is arranged on a top surface 58 of the substrate 52. In some example embodiments, the supporting layer 54 is made of materials with high thermal conductivity. In some example embodiments, the supporting layer 54 is made of a material chosen from a group comprising metal, metal alloy, ceramic, pre-impregnated composite fibers ("pre-preg"), glass, plastic and other suitable materials.

The supporting layer 54 is configured to have an opening 56. The opening 56 has walls 57 substantially perpendicular to the top surface 68 and the bottom surface 59 of the supporting layer 54. When the supporting layer 54 is arranged on top of the substrate 52, the walls 57 of the opening 56 and the exposed portion of the top surface 58 of the substrate 52 form a pocket 60. In this regard, the top surface 58 of the substrate 52 forms the bottom 66 of the pocket 60, and the walls 57 of the opening 56 form the walls 64 of the pocket 60. As described herein, the surface of the pocket walls 64 and the pocket bottom 66 will be referred to as a pocket surface 61.

In some example embodiments, the supporting layer 54 is attached to the substrate 52. In some example embodiments, these layers are attached to each other by an adhesive. In other example embodiments other attachment methods are used. In the exemplary embodiment where the supporting layer 54 comprises a binding agent, such as Pre-Preg or FR-4, during the lamination process, pressure and heat applied onto the stack of layers, including the supporting layer 54, will provide the adhesion force to the conjunction layers.

A reflective layer 62 is arranged at least partially within the pocket 60 and covers at least a portion of the pocket surface 61. In some example embodiments, the reflective layer 62 covers at least a portion of the top surface 68 of the supporting layer 54. In the example embodiment depicted on FIG. 3, the reflective layer 62 completely covers the surface 61 of the pocket 60. However, other types of arrangements of the reflective coating on the surface of the pocket are also envisioned by example embodiments of this invention.

Preferably, the reflective layer 62 has high reflective qualities. In some example embodiments, the reflective layer 62 is composed of foil, such as aluminum foil, silver foil, copper foil, gold foil, nickel foil. In some example embodiments the foil is coated with silver, aluminum, nickel, gold, or a combination thereof. In some example embodiments, the reflective layer 62 is composed of film, such as glass film or plastic film. In some example embodiments the film is coated with silver, aluminum, nickel, gold, chrome or dielectric layers, i.e., dielectric mirror, or a combination thereof. In some example embodiment the surface of the reflective layer opposite the pocket surface is covered by a reflective material, such as silver, aluminum, nickel, chrome, gold, a dielectric layer or a combination thereof.

In some example embodiments, the reflective layer 62 is pre-shaped to fit the pocket 60. Such a pre-formed reflective layer is shaped so that it forms as an insert to be fitted within the pocket 60. In some example embodiments, the reflective layer 62 is attached to the surface of the pocket 60. In some example embodiments, the reflective layer 62 is attached to the surface of the pocket 60 by adhesion. In some example embodiments the reflective layer 62 is attached to the surface of the pocket 60 by a conventional adhesive, such as epoxy or resin. In other example embodiments the reflective layer 62 is attached to the surface of the pocket 60 by a thermal sensitive adhesive (heat induced binding force), pressure sensitive adhesive (pressure induced binding force), or thermal paste. Other methods of attachment can also be used. In another example embodiment, the reflective layer 62 is deposited or sprayed onto the surface of the pocket 60.

A dielectric layer 70 is arranged on top of the top surface 68 of the supporting layer 54. The dielectric layer does not cover the walls 64 of the pocket 60. In the areas of the supporting layer 54 that are covered by the reflective layer 62, the dielectric layer 70 at least partially covers the top surface of the reflective layer 62 where it is covering the In the example embodiments where the reflective layer 62 covers at least a portion of the top surface 68 of the supporting layer 54, the dielectric layer 70 is arranged on top of the supporting layer 54 not covered by the reflective layer 62, and on top of the reflective layer 62 that is covering the portion of the top surface 68 of the support layer 54.

In some example embodiments, electrode pads, conductive leads and/or circuit traces 72 are arranged on top of the dielectric layer 70.

Figure 4:
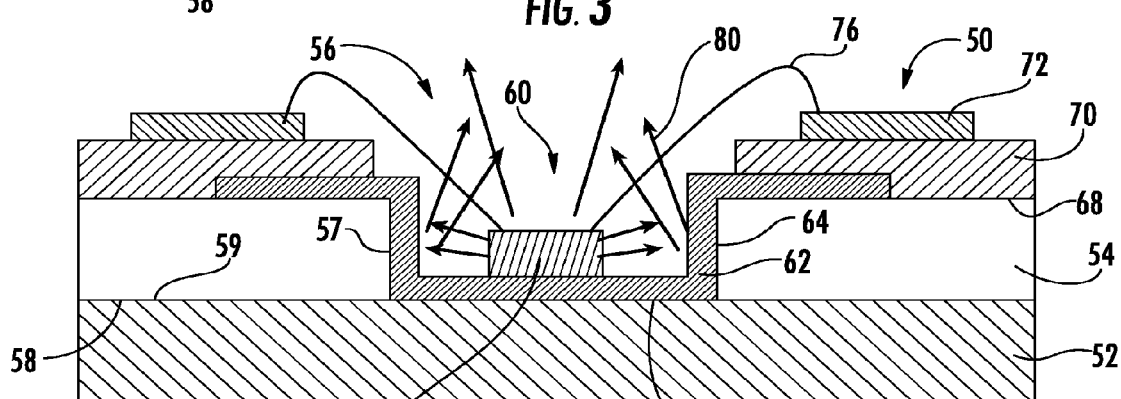
FIGS. 4 and 4A depict a cross-sectional diagram of the device of example embodiments of the present invention with an attached LED die.

FIG. 4 shows the device 50 with an LED die 74 attached to the bottom of the pocket 60 over the reflective layer 62. In some embodiments the LED die 74 is an LED die with top surface coated with a layer of phosphor. The LED die 74 is wire-bonded to the electrode pads and conductive leads 72 by wires 76. As shown on FIG. 4, when the light 78 is emitted by the LED die 74, the portion of the light 78 directed towards the walls and the bottom of the pocket 60 is at least partially reflected of the reflective layer 62. The reflected light 80 is redirected out of the pocket 60 thereby diminishing the brightness loss of the device 50.

Figure 4A:
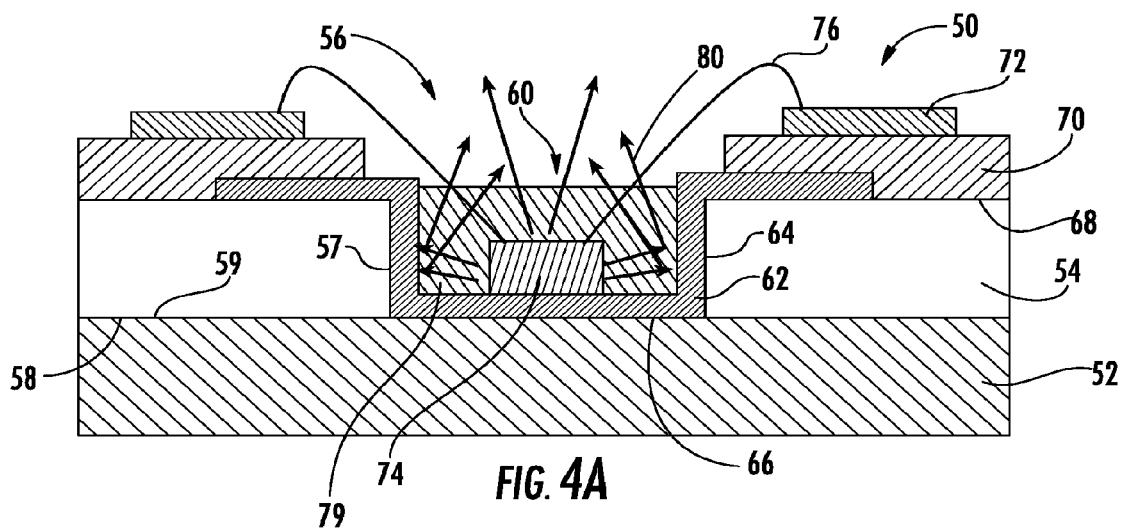

FIG. 4A shows the device 50 where the LED die 74 is a UV LED die and is placed in the pocket 60. Subsequently the pocket 60 is filled with phosphor 79.

Figure 5:
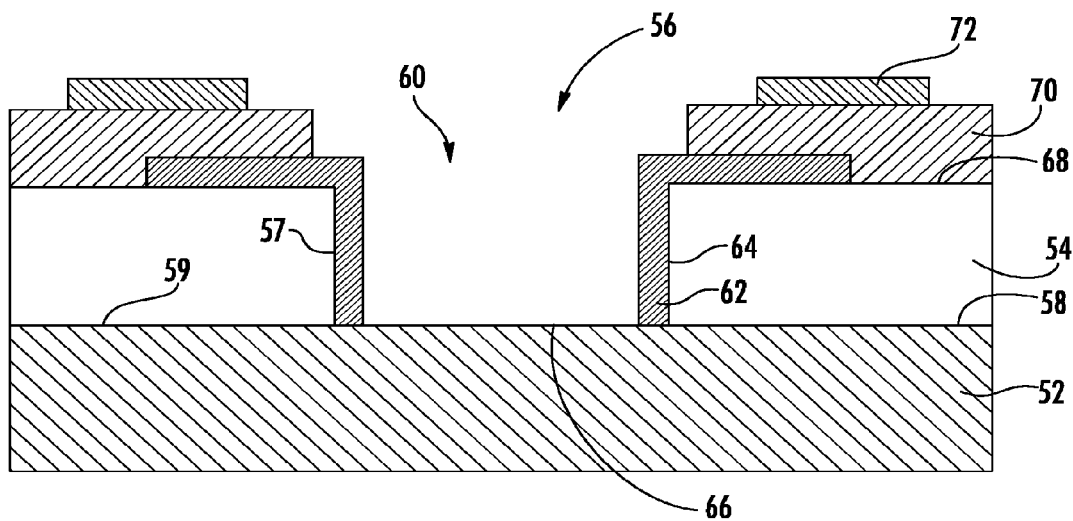
FIGS. 5-8 depict cross-sectional diagrams of devices of other example embodiments of the present invention.

FIG. 5 shows another example embodiment of the present invention. In this example embodiment, the reflective layer 62 covers the walls 64 of the pocket 60, but not the bottom 66 of the pocket 60. In this example embodiment, the bottom 66 of the pocket 60 is not reflective. However, in this example embodiment, the LED die 74 is positioned in direct contact with the substrate 52 improving the thermal dissipation from the LED die 74. Even though the reflective layer 62 covers only the walls 64 of the pocket 60, the reflective layer 62 still improves the light efficiency of the device 50.

Figure 6:
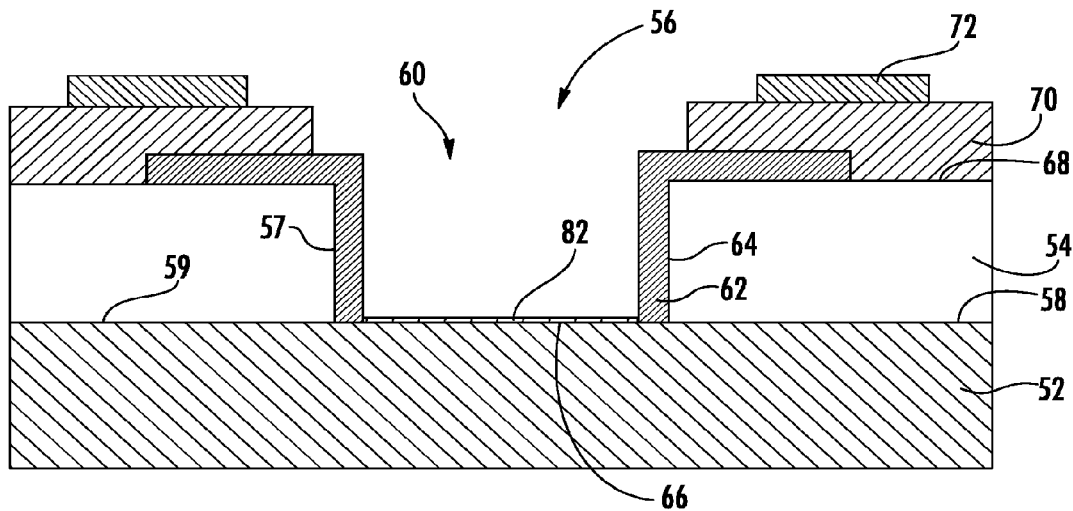

FIG. 6 shows another example embodiment of the present invention. In this example embodiment, as in the example embodiment shown on FIG. 5, the reflective layer 62 covers the walls 64 of the pocket 60, but not the bottom 66 of the pocket 60. However, here the bottom 66 of the pocket 60 is at least partially polished. In some example embodiments, the polished area 82 covers the entire bottom 66 of the pocket 60. In other example embodiments, the polished area 82 covers only part of the bottom 66 of the pocket 60. In the example embodiment shown on FIG. 6, the LED die 74 is position directly on the substrate 52 improving thermal dissipation of from the LED die 74. In some example embodiments the conventional mechanical polishing is used for polishing the surface of the pocket 60. In other exemplary embodiments wet chemical polishing, chemical vapor polishing, or electro-polishing are used to polish the pocket surface.

Figure 7:
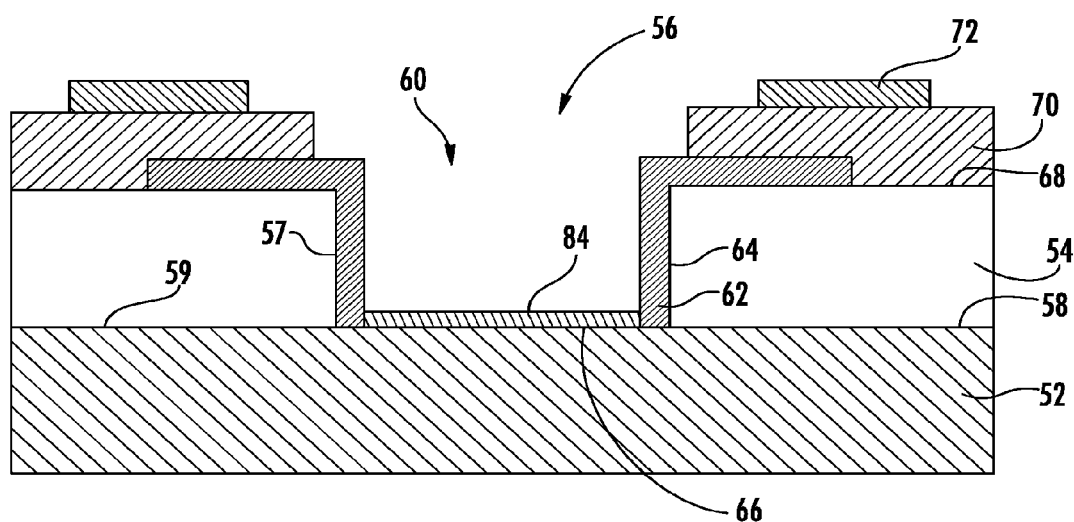

In another example embodiment of the present invention, shown in FIG. 7, the portion of the reflective layer 62 covering the bottom 66 of the pocket 60 is a reflective coating 84. In some example embodiments, the materials used for the reflective coating 84 are selected from a group comprising silver, aluminum, nickel, chrome, gold and dielectric layers. In some example embodiments, the reflective coating 84 is deposited on the top surface 58 of the substrate 52 by physical deposition. In other example embodiments, the reflective coating 84 is deposited by chemical deposition. In some example embodiments, the method of depositing the reflective coating is selected from a group comprising physical vapor deposition (PVD), sputtering, pulse laser deposition, chemical vapor deposition (CVD), plasma-enhanced CVD, plating, chemical solution deposition, e-beam deposition and other methods.

Figure 8:
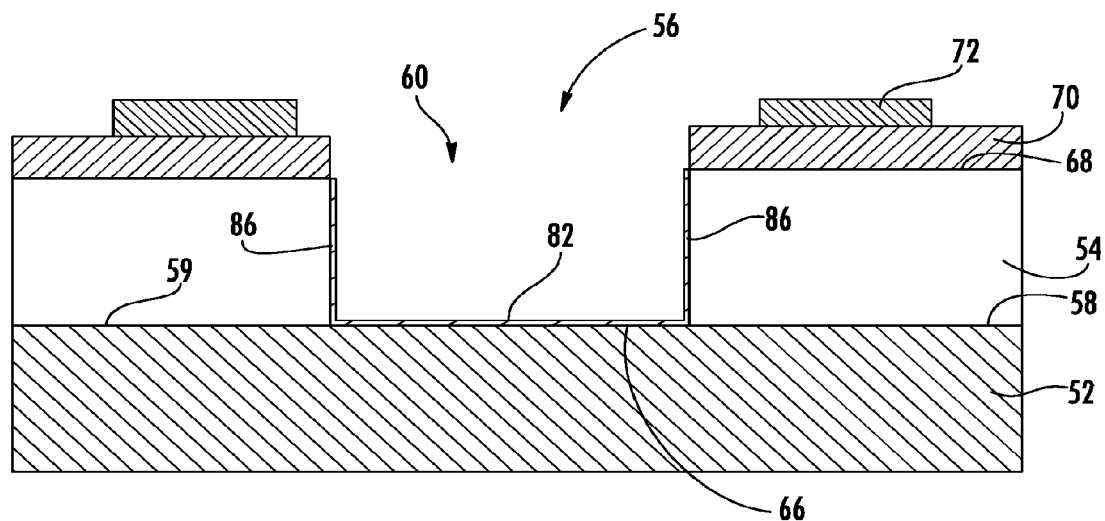
Figures 13A, 13B:
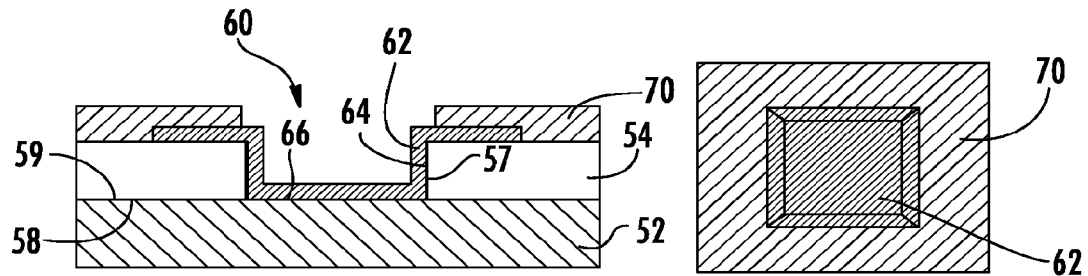
Figures 14A, 14B:
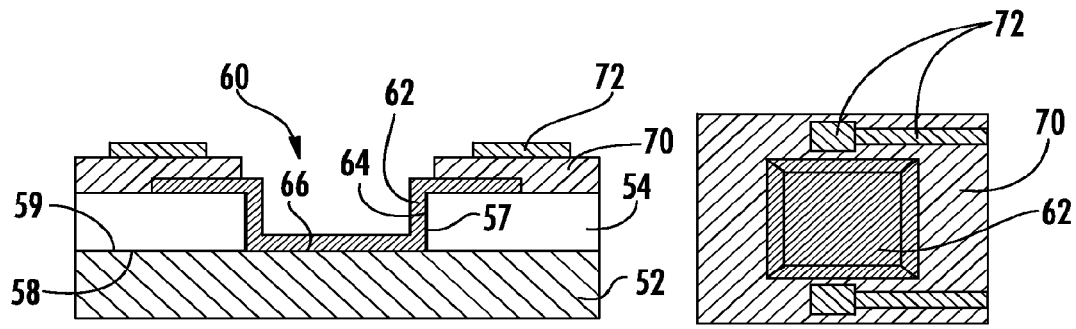
Figures 15A, 15B:
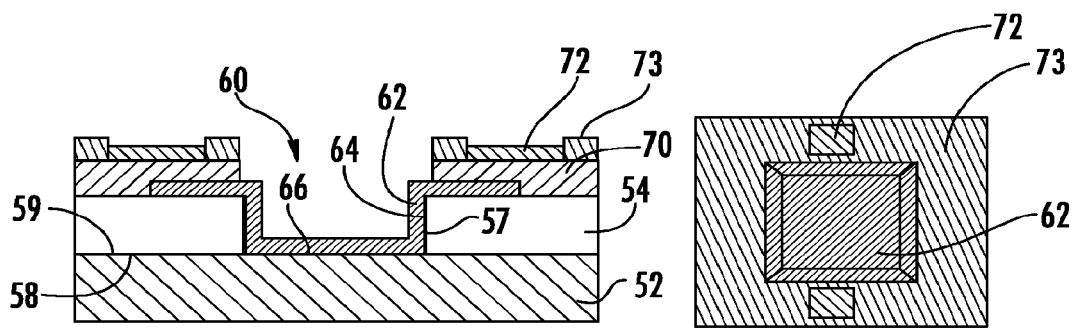

FIG. 8 depicts a further variation of the device 50. In this example embodiment, the walls 64 and the bottom 66 of the pocket 60 are both at least partially polished. The bottom polished area 82 and the wall polished area 86 provide significant increase in the light efficiency of the device 50. In this example embodiment, the LED die 74 is arranged directly on the top surface 58 of the substrate 52 thereby increasing thermal dissipation of the LED die 74.

Other combinations of polishing, providing reflective coating, providing reflective layer of film or foil on the walls 64 and the bottom 66 of the pocket 60 are also envisioned by example embodiments of this invention.

FIGS. 9A, 10A, 11A, 12A, 13A, 14A and 15A are sectional view illustrating manufacturing steps in the assembly of the device of an example embodiment of the present invention. FIGS. 9B, 10B, 11B, 12B, 13B, 14B and 15B are top views illustrating manufacturing steps in the assembly of the device according to an example embodiment of the present invention.

As shown in FIGS. 9A and 9B, first the substrate 52 is obtained. Then, the supporting layer 54 is arranged on top of the substrate 52 (see FIGS. 10A and 10B). FIGS. 11A and 11B show the reflective layer 62 being pre-formed before it is inserted into the pocket 60. After the reflective layer 62 is formed, it is positioned within the pocket 60. (see FIG. 12A). In this example embodiment, the reflective layer 62 covers a portion of the top surface 58 of the supporting layer 54. Next, the dielectric layer 70 is deposited over the top surface 58 of the supporting layer 54 and over the portion of the reflective layer 62 that covers the top surface 58 of the supporting layer 54. (see FIGS. 13A and 13B). In some example embodiments, after the dielectric layer 70 is formed, the electrode pads and conductive leads 72 are formed over the dielectric layer 70. (see FIGS. 14A and 14B). In some example embodiments, a solder mask 73 is applied to the device 50 to cover circuit traces (see FIGS. 15A and 15B).

FIGS. 16A, 17, 18A, 19A and 20A are sectional view illustrating manufacturing steps in the assembly of the device of an example embodiment of the present invention. FIGS. 16B, 18B, 19B and 20B are top views illustrating manufacturing steps in the assembly of the device according to an example embodiment of the present invention.

Figure 16A:
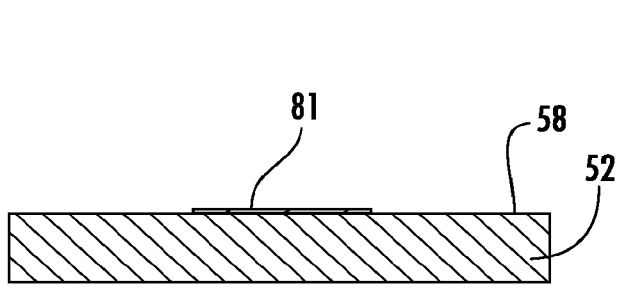
FIGS. 16A, 17, 18A, 19A and 20A depict sectional views illustrating manufacturing steps in the assembly of the device of an example embodiment of the present invention.
Figure 16B:
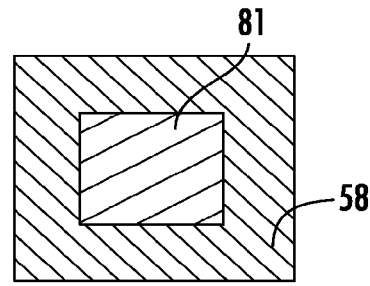
FIGS. 16B, 18B, 19B and 20B are top views illustrating manufacturing steps in the assembly of the device according to an example embodiment of the present invention.

As shown in FIGS. 16A and 16B, first the substrate 52 is obtained. In this exemplary embodiment, at least a portion 81 of the top surface 58 of the substrate 52 is reflective. In some exemplary embodiments, the portion 81 is reflective due to its being covered with a reflective coating. In other exemplary embodiments the portion 81 is polished.

Figure 17:
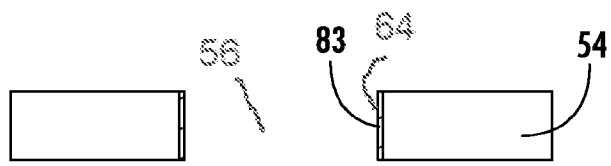

FIG. 17 shows the step of preparing the supporting layer 54 for the assembly. At least a portion 83 of the walls 64 of the opening 56 is reflective. In some exemplary embodiments, the portion 83 of the walls 64 is covered with a reflective coating. In other exemplary embodiments, the portion 83 of the walls 64 is polished.

Figure 18A:
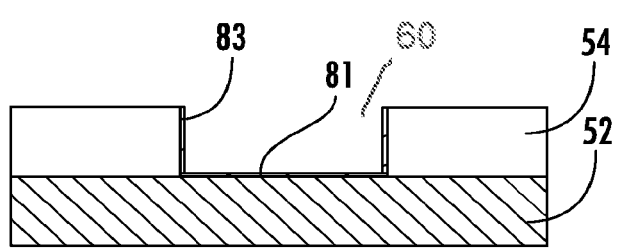
Figure 18B:
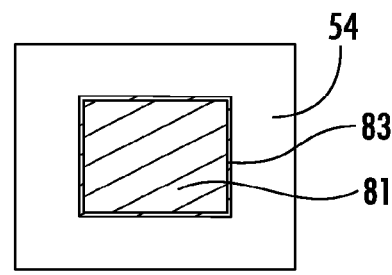
Figure 19A:
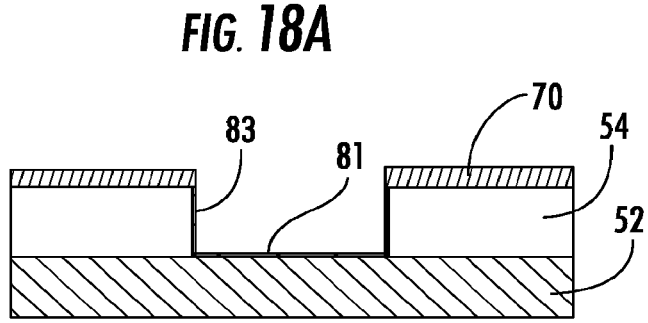
Figure 19B:
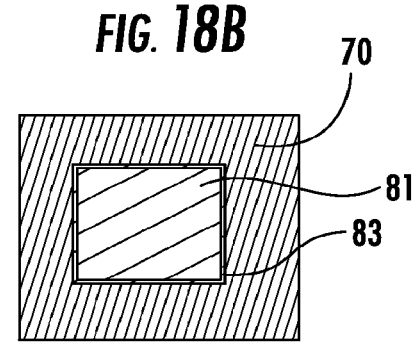
Figure 20A:
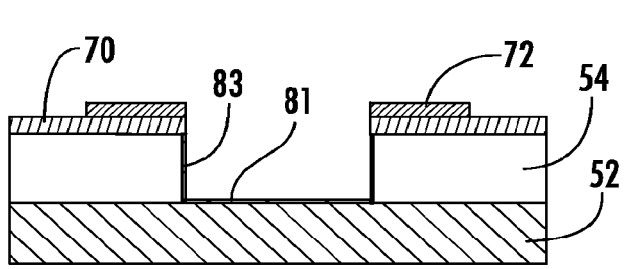
Figure 20B:
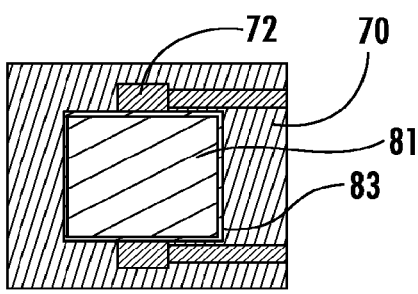

FIGS. 18A and 18B show the step of attaching the supporting layer 54 to the substrate 52 thereby forming the pocket 60. FIGS. 19A and 19B show the step of providing the dielectric layer 70 over the supporting layer 54. FIGS. 20A and 20B show the step of forming the electrode pads and conductive leads 72 over the dielectric layer 70.

In some exemplary embodiments of the invention, multiple devices 50 are fabricated simultaneously. FIG. 21A depicts a strip 85 where multiple pockets 60 are located along the longitudinal axis of the strip 85. FIG. 21B depicts an enlarged portion of the strip 85 with the inner surface of the pocket 60 being covered with the reflective layer 62.

Many modifications and other example embodiments set forth herein will come to mind to one skilled in the art to which these example embodiments pertain having the benefit of the teachings presented in the foregoing descriptions and the associated drawings. Therefore, it is to be understood that the embodiments are not to be limited to the specific ones disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions other than those explicitly described above are also contemplated as may be set forth in some of the appended claims. Although specific terms are employed herein, they are used in a generic and descriptive sense only and not for purposes of limitation.

That which is claimed:

1. An LED device comprising
   a substrate having a substrate top surface;
   a supporting layer arranged on the substrate top surface, the supporting layer having a supporting layer top surface, a supporting layer bottom surface and walls substantially perpendicular to the supporting layer top surface and the supporting layer bottom surface, the walls defining an opening in the supporting layer, wherein the walls and the substrate top surface form a pocket having pocket walls and a pocket bottom that form a pocket surface;
   a reflective layer covering at least a portion of the pocket surface; and
   a dielectric layer arranged over at least a portion of the supporting layer top surface such that the dielectric layer does not block access to the pocket.

2. The LED device of claim 1 wherein the reflective layer covers at least a portion of the pocket bottom.

3. The LED device of claim 1 wherein the reflective layer covers at least a portion of the pocket walls.

4. The LED device of claim 1 wherein the reflective layer is foil.

5. The LED device of claim 1 wherein the reflective layer is film.

6. The LED device of claim 1 wherein the reflective layer is covered by a reflective material.

7. The LED device of claim 1 wherein the reflective layer is a reflective coating.

8. The LED device of claim 1 wherein at least a portion of the reflective layer covers at least a portion of the supporting layer top surface.

9. The LED device of claim 8 wherein the dielectric layer at least partially covers the top surface of the portion of the reflective layer covering the portion of the supporting layer top surface.

10. The LED device of claim 1 wherein the supporting layer is attached to the substrate by an adhesive.

11. The LED device of claim 1 wherein the reflective layer is attached to the supporting layer by an adhesive.

12. The LED device of claim 1 wherein electrode pads are arranged on top of the dielectric layer, and an LED die connected to the electrode pads is arranged on the pocket bottom.

13. The LED device of claim 12 wherein wires connect the LED die and the electrode pads.

14. The LED device of claim 12 wherein the pocket is filled with phosphor.

* * * * *